(12) United States Patent
Jonker et al.

(10) Patent No.: US 6,316,965 B1
(45) Date of Patent: Nov. 13, 2001

(54) NON-VOLATILE REPROGRAMMABLE LOGIC CIRCUITS BY COMBINING NEGATIVE DIFFERENTIAL RESISTANCE DEVICES AND MAGNETIC DEVICES

(75) Inventors: Berend T. Jonker, Davidsonville; Richard Magno, Waldorf, both of MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/593,809

(22) Filed: Jun. 15, 2000

(51) Int. Cl.⁷ .................................................. H03K 19/10
(52) U.S. Cl. ........................... 326/134; 326/135; 327/570
(58) Field of Search .................................. 326/134, 135, 326/132; 327/568, 570

(56) References Cited

U.S. PATENT DOCUMENTS

| | | | |
|---|---|---|---|
| 4,902,912 | 2/1990 | Capasso et al. | 307/322 |
| 5,128,894 | 7/1992 | Lin | 365/168 |
| 5,229,623 | 7/1993 | Tanoue et al. | 257/25 |
| 5,265,044 | 11/1993 | Singh | 364/784 |
| 5,280,445 | 1/1994 | Shieh et al. | 365/175 |
| 5,313,117 * | 5/1994 | Maezawa | 326/134 |
| 5,469,163 | 11/1995 | Taddiken | 341/83 |
| 5,477,169 | 12/1995 | Shen et al. | 326/55 |
| 5,714,891 | 2/1998 | Lin et al. | 326/59 |
| 5,773,996 * | 6/1998 | Takao | 326/135 |
| 5,789,940 | 8/1998 | Taddiken | 326/60 |
| 5,815,008 | 9/1998 | Williamson, III et al. | 326/134 |
| 5,903,170 | 5/1999 | Kulkarni et al. | 326/134 |
| 5,942,952 * | 8/1999 | Nair et al. | 331/115 |

OTHER PUBLICATIONS

T. Whitaker, "Tunnel Diodes Break Through At Last" Compound Semiconductors 4, No. 3, (1998) pp. 36–41.

P. Mazumder, et al, "Digital Circuit Applications of Resonant Tunneling Devices" Proc. IEEE 86, (1998) pp. 664–686.

K.J. Chen, et al, "Monostable–Bistable Transition Logic Elements (MOBILEs) Based on Monolithic Integration of Resonant Tunneling Diodes and FETs" Jpn. J. Appl. Phys. 34, Pt. 1, No. 2B, 1199 (1995).

L.J. Micheel and M.J. Paulus, "Differential Multiple–Valued Logic Using Resonant Tunneling Diodes" Proc. 20th Intl. Symp. Multiple–valued Logic, Charlotte, NC, 1990, pp. 189–195.

J.F. Young, et al., "Effect of Circuit Oscillations on the dc Current–Voltage Characteristics of Double Barrier Resonant Tunneling Structures" Appl. Phys. Lett. 52, 1398 (1988).

K. Bandara and D.D. Coon, "Quantum Effects and Bit Errors in Mesoscopic Logic and Memory Circuits" Appl. Phys. Lett. 57, 58 (1990).

(List continued on next page.)

Primary Examiner—Michael Tokar
Assistant Examiner—James H Cho
(74) Attorney, Agent, or Firm—John J. Karasek; Philip E. Ketner (57) ABSTRACT

A circuit includes at least one negative differential resistance (NDR) device and at least one magnetic device having reversibly variable resistance, wherein the negative differential resistance device and the magnetic device are operatively connected so that changing the resistance of the magnetic device changes the current-voltage response characteristics of the circuit. NDR devices and magnetic devices can be arranged to form multiple value logic (MVL) cells and monostable-bistable transition logic elements (MOBILE), and these logic cells can form the components of a field programmable gate array.

53 Claims, 6 Drawing Sheets

PROGRAMMABLE NON-VOLATILE RESISTANCE

OTHER PUBLICATIONS

L. L. Chang et al, "Resonant Tunneling in Semiconductor Double Barriers" Applied Physics Letters, vol. 24, No. 12, Jun. 15, 1974, pp 593–595.

J.R. Söderström et al, New Negative Differential Resistance Device Based on Resonant Interband Tunneling, Appl. Phys. Lett. 55 (11), Sep. 11, 1989 pp 1094–1096.

Sollner et al., "Resonant Tunneling through Quantum Wells at Frequencies up to 2.5 THz" Appl. Phys. Lett. 43 (6) Sep. 15, 1983 pp 588–590.

Brown et al, "Oscillations up to 712 GHz in InAs/AlSb Resonant–Tunneling Diodes", Appl. Phys. Lett. 58 (20) May 20, 1991.

E. Özbay, et al "1.7–ps, Microwave, Integrated–Circuit–Compatible InAs/AlSb Resonant Tunneling Diodes" IEEE Electron Device Letters, vol. 14, No. 8, Aug. 1993, pp 400–402.

Shiralagi et al, "Effects of Layer Design on the Performance of InAs/AlSb/GaSb Resonant Interband Tunneling Diodes on GaSb Substrates" Journal of Electronic Materials, vol. 26, No. 12 pp 1417–1421.

Egelhoff, et al, "Oxygen as a Surfactant in the Growth of Giant Magnetoresistance Spin Valves" J. Appl. Phys. 82, 6142 (1997).

Hauck, S. "The Roles of FPGAs in Reprogrammable Systems" Proc. IEEE 86, (1998) pp 615–638.

Fawcett, B.K., "Taking Advantage of Reconfigurable Logic" Proceedings of the $7^{th}$ Annual IEEE International, ASIC Conference and Exhibit, 1994, pp 227–230.

Niu, et al, "Circuit Modeling of Programmable Logic Gate Based on Controlled Quenching of Series–Connected Nigative Differential Resistance Devices", 1997 IEEE International Symposium on Circuits and Systems, pp 1628–1631.

Prost, W. et al, "InP–Based HFET's and RTD's for High Speed Digital Circuitry" International Symposium on SIgnls, Systems and Electronics, Pisa, Sep. 29–Oct. 2, 1998, Paper WM1–3.

Maezawa, K. et al, "Functions and Applications of Monostable–Bistable Transition Logic Elements (MOBILE's) Having Multiple–Input Terminals" IEEE Transactions on Electron Devices, vol. 41, No. 2, Feb. 1994 pp 148–143.

Arai, K. "Static Frequency Divider Featuring Reduced Circuit Complexity by Utilizing Resonant Tunneling Diodes in Combination with HEMT's" IEEE Electron Device Letters, vol. 18, No. 11, Nov. 1997 pp 544–546.

Prinz, G.A., "Magnetoelectronics" Science, vol. 282, pp 1660–1663.

Rajsuman, R., "Design of Reprogrammable FPLA", Electronic Letters. May 25, 1989, vol. 25, No. 11, pp. 715–716.

Fawcett, B.K. and Watson, J. "Reconfigurable Processing with Field Programmable Gate Arrays", Proceedings of International Conference on Application Specific Systems, Architectures and Processors, 1996. ASAP 96 pp 293–302.

Goser, K. and Pacha, C. System and Circuit Aspects of Nanelectronics ESSCIRC '98, $24^{th}$ European Solid–State Circuits Conference, The Hague, Sep. 1998.

* cited by examiner

(PRIOR ART)

DOUBLE TUNNEL BARRIER

FIG. 6b

PROGRAMMABLE
NON-VOLATILE
RESISTANCE

NON-VOLATILE REPROGRAMMABLE LOGIC CIRCUITS BY COMBINING NEGATIVE DIFFERENTIAL RESISTANCE DEVICES AND MAGNETIC DEVICES

BACKGROUND OF THE INVENTION

1. Field of the Invention

The invention relates to circuits and logic circuits generally, and in particular to logic circuits having non-volatile reprogrammable operating characteristics.

2. Description of the Related Art

Figure 2:
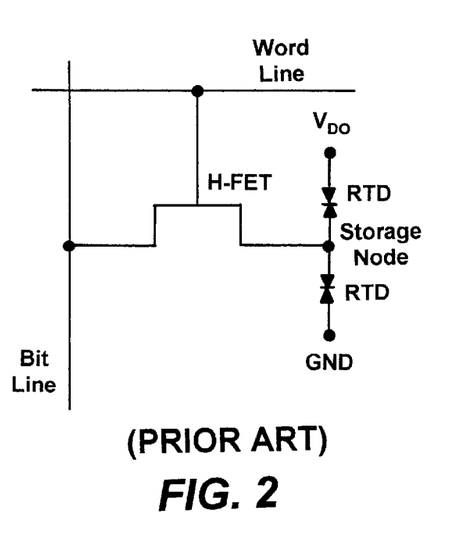
FIG. 2 (prior art) is a circuit diagram of a single transistor tunneling-based SRAM cell with two resonant tunneling diodes. (from T. Whitaker, "Tunnel diodes Break Through At Last" Compound Semiconductors 4, no. 3, (1998), FIG. 3 is a current-voltage graph showing the measured load line for the cell shown in FIG. 2 (also from T. Whitaker, referenced above)
Figure 3:
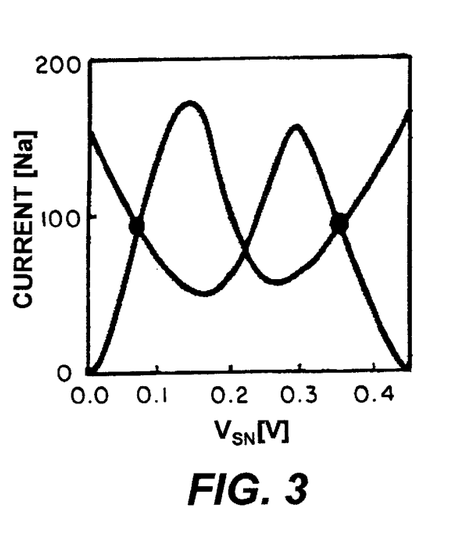

The need for extremely low power and high frequency device elements for digital signal processors, logic devices, and data storage and retrieval has led to a rapid increase in research on negative differential resistance (NDR) devices, particularly resonant tunneling diodes (RTDs), which offer high frequency operation (greater than 100 GHz) and extremely low operating voltages (less than 400 meV). The resonant tunneling diode has a unique N-shaped current-voltage (I-V) response characteristic (FIG. 1) that provides a negative differential resistance above the voltage corresponding to an initial peak current. Voltages that define the peak, negative differential resistance and valley regimes can be exploited to define "high" and "low" states of a logic or memory cell. Resonant tunneling diodes feature a ultra-high speed transient response, with a switching time of less than 1 picosecond, that allows operation in the terahertz frequency regime. When coupled with high speed transistors, resonant tunneling diodes form the basis for a highly functional, low component count architecture for logic, signal processing and memory applications. (See, for example, T. Whitaker, "Tunnel Diodes Break Through At Last" Compound Semiconductors 4, no. 3, (1998) pp. 36–41, P. Mazumder,et al, "Digital Circuit Applications of Resonant Tunneling Devices" Proc. IEEE 86, (1998) pp. 664–686, Niu, et al, "Circuit Modeling of Programmable Logic Gate Based on Controlled Quenching of Series-Connected Nigative Differential Resistance Devices", 1997 IEEE International Symposium on Circuits and Systems, pp 1628–1631, and Goser ,K. and Pacha, C. "System and Circuit Aspects of Nanoelectronics ESSCIRC '98, 24$^{th}$ European Solid-State Circuits Conference", The Hague, September 1998, all incorporated herein by reference.) FIG. 2 (reproduced from Whitaker) shows a static random access memory (SRAM) cell made up of two resonant tunneling diodes (RTDs) and a single heterojunction field effect transistor (HFET). A single bit is stored at the storage node, which is also the source of the HFET. FIG. 3 shows the measured load line for the cell under 0.45V bias. Dots show the stable latch states.

Figure 4:
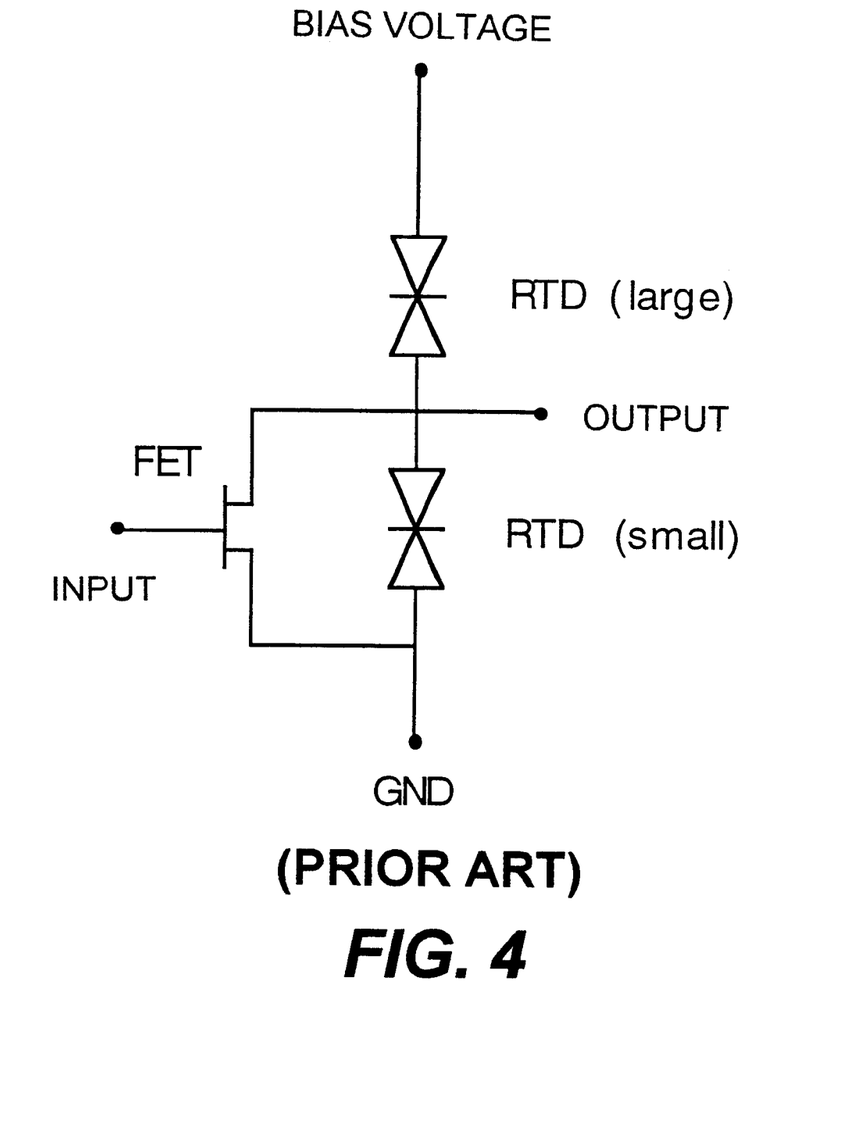
FIG. 4 (prior art) is a circuit diagram of a monostable-bistable transition logic element (MOBILE). (from K. J. Chen, et al, "Monostable-Bistable Transition Logic Elements (MOBILEs) Based on Monolithic Integration of Resonant Tunneling Diodes and FETs", Jpn. J. Appl. Phys. 34, Pt. 1, No. 2B, 1199 (1995))

A fast and highly compact logic element known as a MOBILE (monostable-bistable transition logic element) can be fabricated from a FET and two RTDs, as shown in FIG. 4 (see, for example, P. Mazumder, supra, page 672 and K. J. Chen, et al, "Monostable-Bistable Transition Logic Elements (MOBILEs) Based on Monolithic Integration of Resonant Tunneling Diodes and FETs" Jpn. J. Appl. Phys. 34, Pt. 1, No. 2B, 1199 (1995), incorporated herein by reference).

Figure 5A:
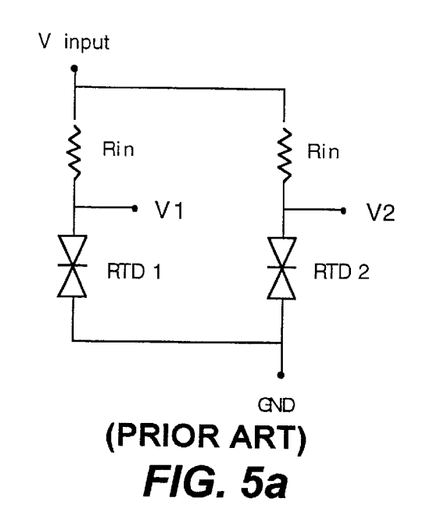
FIG. 5a (prior art) is a circuit diagram of a multiple value logic circuit made up of two subsystems in parallel, each subsystem being made up of a resonant tunneling diode and a resistor. (after L. J. Micheel and M. J. Paulus, "Differential Multiple-Valued Logic Using Resonant Tunneling Diodes" Proc. 20th Intl. Symp. Multiple-valued Logic, Charlotte, N.C., 1990, pp. 189–195)

Multiple-value logic circuits have been fabricated from parallel combinations of an RTD subsystem which consists of an RTD in series with a load resistor, as shown in FIGS. 5a (see, for example P. Mazumder, supra, page 672 and L. J. Micheel and M. J. Paulus, "Differential Multiple-Valued Logic Using Resonant Tunneling Diodes", Proc. 20th Intl. Symp. Multiple-valued Logic, Charlotte, N.C., 1990, pp. 189–195, incorporated herein by reference).

Typical memory cells and logic circuits using resonant tunneling diodes or other negative differential resistance devices are described in the following U.S. patents incorporated herein by reference: U.S. Pat. No. 5,128,894 to Lin; U.S. Pat. No. 5,162,877 to Mori; U.S. Pat. No. 5,265,044 to Singh; U.S. Pat. No. 5,229,623 to Tanoue, et al; U.S. Pat. No. 5,280,445 to Shieh et al; U.S. Pat. No. 5,294,566 to Mori; U.S. Pat. No. 5,311,465 to Mori; U.S. Pat. No. 5,390,145 to Nakasha, et al; U.S. Pat. No. 5,408,107 to Neikirk, et al; U.S. Pat. No. 5,477,169 to Shen et al; U.S. Pat. No. 5,535,156 to Levy et al; U.S. Pat. No. 5,646,884 to van der Wagt; U.S. Pat. No. 5,714,891 to Lin et al; U.S. Pat. No. 5,745,407 to Levy, et al; U.S. Pat. No. 5,789,940 to Taddiken; U.S. Pat. No. 5,773,996 to Takao; U.S. Pat. No. 5,811,832 to Alphenaar et al; U.S. Pat. No. 5,815,008 to Williamson III; U.S. Pat. No. 5,869,845 to van der Vagt, et al; U.S. Pat. No. 5,883,829 to van der Vagt; U.S. Pat. No. 5,903,170 to Kulkarni, et al; U.S. Pat. No. 5,930,323 to Tang; U.S. Pat. No. 5,953,249 to van der Vagt; and U.S. Pat. No. 5,981,969 to Yuan et al.

A disadvantage of typical memory and logic circuits based on resonant tunneling diodes is that, typically, the memory or logic state created in such circuits is volatile.

Another recent development in computer technology is the creation of sensors and non-volatile memory cells using magnetic devices based on giant magnetoresistance (GMR) or spin-dependent tunneling junctions (STJ). A typical giant magnetoresistance device or spin-dependent tunneling junction device consists of two or more ferromagnetic films separated by a non-magnetic spacer layer. The essential characteristic of such a device is that the electrical resistance of the structure depends upon the relative orientation of the magnetization of the individual magnetic layers: the resistance is low when the magnetic moments of the layers are parallel, and high when they are antiparallel. The relative orientation of the magnetization can be changed by applying a magnetic field. (This is typically accomplished by applying a fringe field from current pulse through an adjacent wire.) The values of the resistance of these devices and their change in resistance with the change in magnetic field depend upon the materials used and details of the structure. The change in resistance that can be brought about can range from a few percent to well over 100%. Such devices can be tailored to exhibit a resistance which can be reversibly and continuously varied between a high and low value with applied magnetic field, with a single stable resistance state at zero applied magnetic field. Such devices are currently used as sensors in magnetic disk drive read heads, for example. Alternatively, these magnetic devices can also be tailored to exhibit at least two stable resistance values, corresponding, for example, to parallel and antiparallel orientation of the magnetization of the magnetic layers—the change in orientation of the magnetization is typically reversible and non-volatile (a voltage is not required to maintain a specific orientation). Typical giant magnetoresistance devices and spin-dependent tunneling junction devices and the use of these devices in memory elements are described, for example, in the following publications and U.S. patents, incorporated herein by reference: Prinz, G. A., "Magnetoelectronics", Science, 282, pp 1660–1663, U.S. Pat. No. 5,287,238 to Baumgart, et al; U.S. Pat. No. 5,459, 687 to Sakakima, et al; U.S. Pat. No. 5,477,482 to Prinz; U.S. Pat. No. 5,587,943 to Torok, et al; U.S. Pat. No. 5,629,922 to Moodera, et al; U.S. Pat. No. 5,640,343 to Gallagher, et al; U.S. Pat. No. 5,661,062 to Prinz; U.S. Pat. No. 5,732,016 to Chen, et al; U.S. Pat. No. 5,764,567 to Parkin; U.S. Pat. No. 5,793,697 to Schuerlein; U.S. Pat. No.

5,801,984 to Parkin; U.S. Pat. No. 5,835,314 to Moodera, et al; U.S. Pat. No. 5,841,692 to Gallagher, et al; U.S. Pat. No. 5,852,574 to Naji; U.S. Pat. No. 5,936,293 to Parkin; U.S. Pat. No. 5,936,882 to Dunn; U.S. Pat. No. 5,949,707 to Pohm, et al; U.S. Pat. No. 5,966,322 to Pohm et al; U.S. Pat. No. 5,969,978 to Prinz; U.S. Pat. No. 6,005,800 to Koch, et al; and U.S. Pat. No. 6,021,065 to Daughton, et al.

SUMMARY OF THE INVENTION

Accordingly, it is an object of the present invention to provide a circuit that has negative differential resistance operating characteristics that can be altered in a reversible and continuously variable manner.

Accordingly, it is a further object of the present invention to provide a circuit that has negative differential resistance operating characteristics that can be altered in a reversible and nonvolatile manner.

It is a further object of the present invention to provide a memory cell that exploits the advantages, including high frequency operation and low operating voltages, of negative differential resistance devices, and that has nonvolatile memory.

It is a further object of the present invention to provide a logic circuit that exploits the advantages, including high frequency operation and low operating voltages, of negative differential resistance devices, and that is both reprogrammable and nonvolatile.

It has now been found that when a negative differential resistance device, such as a resonant tunneling diode, is connected in series with a magnetic device having variable and reversible resistance, such as a giant magnetoresistance device or spin-dependent tunneling junction device, the magnetic device can be used to alter the operating curves and redefine the high and low states of the resulting circuit in a reversible, non-volatile manner. Moreover, in a logic or memory cell of a type that uses switching between two or more resonant tunneling diodes by means of a field effect transistor connected in parallel to one of the resonant tunneling diodes, a magnetic device can be used in place of the field effect transistor to accomplish the switching in a nonvolatile manner.

Accordingly, the present invention is directed to a circuit made up of at least one negative differential resistance device operatively connected to at least one magnetic device having reversibly variable resistance. As used herein, the term "operatively connected" means that one or more negative differential resistance devices are connected in a circuit with one or more magnetic devices so that changing the resistance of one or more of the magnetic devices changes the NDR current-voltage response characteristics of the circuit. As described below, negative differential resistance devices and magnetic devices may be connected in series or in parallel or a combination of series and parallel, depending on the design and purpose of the particular circuit. The invention is further directed to field programmable gate arrays, multiple-value logic circuits, monostable-bistable transition logic cells and other devices incorporating a combination of negative differential resistance devices and magnetic devices having reversibly variable resistance.

BRIEF DESCRIPTION OF THE DRAWINGS

A more complete appreciation of the invention will be readily obtained by reference to the following Description of the Preferred Embodiments and the accompanying drawings.

FIG. 5b is a graph showing the current-voltage characteristics of each subsystem of the circuit of FIG. 5a.

DETAILED DESCRIPTION OF THE PREFERRED EMBODIMENTS

As used herein, the terms "negative differential resistance device" and "NDR device" refer generally to any device (including, but not limited to a resonant tunneling diode), having negative differential resistance characteristics. (As used herein, the term "resonant tunneling diode" (RTD) includes resonant interband tunneling diodes (RITD) as a subset.) Materials, configurations and methods of fabrication of negative differential resistance devices, including resonant tunneling diodes, are known generally in the art and are described, for example, in above-referenced patents and publications. See also the following publications incorporated herein by reference: L. L. Chang et al, "Resonant Tunneling in Semiconductor Double Barriers" Applied Physics Letters, Vol 24, No. 12, Jun. 15, 1974, pp 593–595; J. R. Söderström et al, "New Negative Differential Resistance Device Based on Resonant Interband Tunneling", Appl. Phys. Lett. 55 (11), Sep. 11, 1989 pp 1094–1096; Sollner et al, "Resonant Tunneling through Quantum Wells at Frequencies up to 2.5 THz" Appl. Phys. Lett. 43 (6) Sep. 15, 1983 pp 588–590; Brown et al, "Oscillations up to 712 GHz in InAs/AlSb Resonant-Tunneling Diodes". Appl. Phys. Lett. 58 (20) May. 20, 1991; E. Özbay, et al "1.7-ps, Microwave, Integrated-Circuit-Compatible InAs/AlSb Resonant Tunneling Diodes" IEEE Electron Device Letters, Vol. 14, No. 8, August 1993, pp 400–402 and Shiralagi et al, "Effects of Layer Design on the Performance of InAs/AlSb/GaSb Resonant Interband Tunneling Diodes on GaAs Substrates" Journal of Electronic Materials, Vol 26, No. 12 pp 1417–1421.

An example of a typical resonant tunneling diode is a layered structure as follows: 100 Å InAs/10 Å AlSb/60 Å InAs/10 Å AlSb/100 Å InAs, grown on an appropriate substrate such as InAs(100) using an epitaxial growth technique such as, for example, molecular beam epitaxy.

An example of a typical resonant interband tunneling diode is a layered structure as follows: 100 Å Inas/10 Å AlSb/60 Å GaSb/10 Å AlSb/100 Å InAs, grown on an appropriate substrate such as InAs(100) using an epitaxial growth technique such as, for example, molecular beam epitaxy.

The above examples are given to illustrate embodiments of the negative differential resistance component of the invention and are not intended to limit the scope of the invention.

Figure 1:
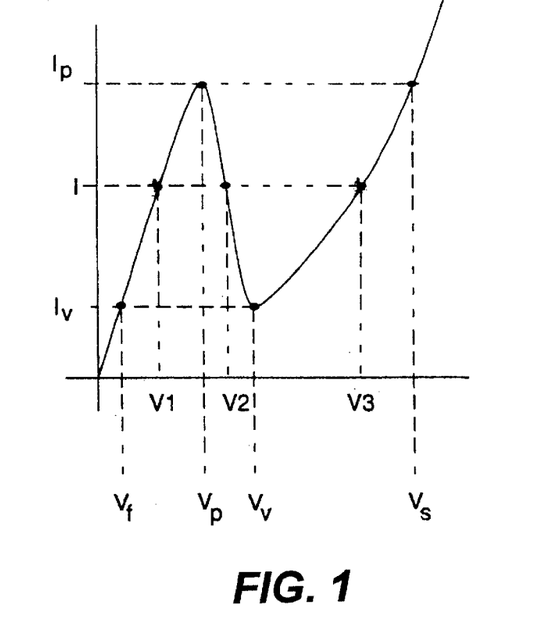
FIG. 1 is a graph showing the current-voltage characteristics of a typical resonant tunneling device. (prior art) (from P. Mazumder, et al, "Digital Circuit Applications of Resonant Tunneling Devices" Proc. IEEE 86, (1998) pp 664–686.)

A negative differential resistance device typically has an N-shaped current-voltage curve, as depicted in the graph in FIG. 1. As shown in FIG. 1, the current-voltage curve typically has an initial positive differential region rising to an initial peak current at (Ip,Vp). After the initial peak, there is a region of negative differential resistance (the current decreases as the voltage increases) until a valley is reached at (Iv, Vv). Thereafter, the current increases as the voltage increases.

Figure 6A:
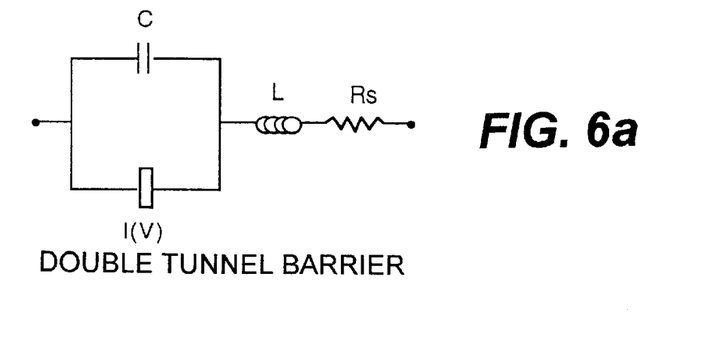
FIG. 6a is a circuit diagram of an equivalent circuit of a resonant tunneling diode. (after J. F. Young, et al., "Effect of Circuit Oscillations on the dc Current-Voltage Characteristics of Double Barrier Resonant Tunneling Structures", Appl. Phys. Lett. 52, 1398 (1988) and K. Bandara and D. D. Coon, "Quantum Effects and Bit Errors in Mesoscopic Logic and Memory Circuits", Appl. Phys. Lett. 57, 34 (1990)).
Figure 6B:
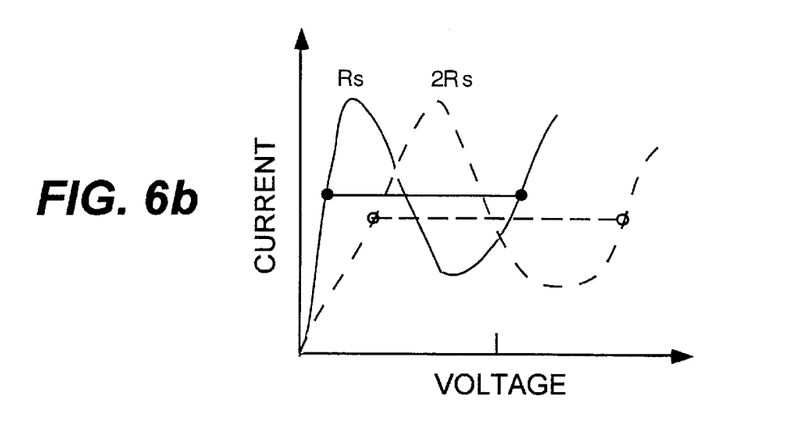
FIG. 6b is a graph showing current-voltage operating curves of the circuit of FIG. 6a for two different resistance values, Rs and R2s of the series resistor.

As shown in FIG. 6a, the equivalent circuit of an resonant tunneling diode (which is used here as an example of a negative differential resistance device) and associated parasitics consists of a series resistance $R_s$ and inductance L, and a parallel capacitance C. (For more explanation, see, for example, J. F. Young, "Effect of Circuit Oscillations on the dc Current-Voltage Characteristics of Double Barrier Resonant Tunneling Structures", et al., Appl. Phys. Lett. 52, 1398 (1988) and K. Bandara and D. D. Coon, "Quantum Effects and Bit Errors in Mesoscopic Logic and Memory Circuits" Appl. Phys. Lett. 57, 34 (1990), both incorporated herein by reference). The resistor $R_s$ modifies the ideal current-voltage characteristics of the resonant tunneling diode and determines the voltages at which the peak current and the negative differential resistance regime occur. Hence, $R_s$ defines the stable operating regimes, that is, the "high" and "low" states of the device when the device is incorporated in a logic or memory circuit. As shown in the comparative I-V curves of FIG. 6b, increasing $R_s$ to $2R_s$ increases the operating voltage of the device, essentially stretching the N-shaped I-V characteristic along the positive voltage axis, thus redefining the "high" and "low" states from the solid pair of circles on the curve labeled "$R_s$" to the open pair of circles on the curve labeled "$2R_s$".

Figure 6C:
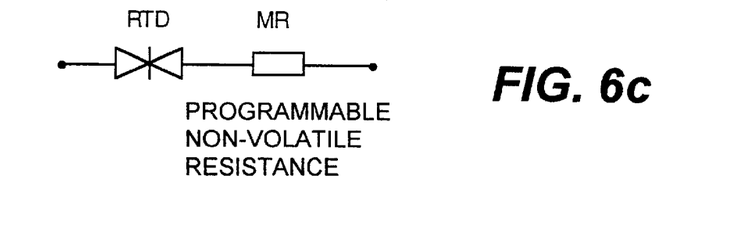
FIG. 6c is a circuit diagram of a resonant tunneling device/magnetic resistance device combination of the present invention.

Thus, it has now been discovered that, according to one aspect of the present invention, by adding a resistance with selectable values in series with $R_s$, it is possible to define multiple operating curves for a circuit that comprises the resonant tunneling device and the selectable resistance, thereby creating a reprogrammable circuit (see FIG. 6c, wherein RTD is a resonant tunneling device and MR is a magnetic resistance device). Reasonable values for the selectable portion of the resistance would be of the same order as the equivalent circuit resistance $R_s$ of the resonant tunneling diode itself, and would depend primarily on the constituent materials and device size.

In the present invention, a selectable or variable resistance is provided by a magnetic device having reversibly variable resistance. As used herein, the terms "magnetic device" and "magnetic device having reversibly variable resistance" refer to a device (such as, for example, a giant magnetoresistance device or spin-dependent tunneling junction device) for which the resistance can be discretely or continuously selected by changing the relative orientation of the magnetization of magnetic layers that make up the device. Materials, configurations and methods of construction of giant magnetoresistance devices and spin-dependent tunneling junction devices are generally known in the art and are described, for example, in above-referenced patents and publications.

An example of a typical giant magnetoresistance device having reversibly variable resistance is a multilayer structure consisting of 30 repeats of the unit (21 Å Cu/40 Å Co). This example is not intended to limit the scope of the invention.

In the simplest case, a magnetic device defines two resistance values- a relatively low resistance when the magnetic moments of the magnetic layers of the device are parallel and a relatively high resistance when the magnetic moments of the magnetic layers of the device are antiparallel. Typically, the orientation of the magnetic layers is selected by pulsing a current through a nearby wire or "write line" to produce a magnetic field of the desired direction and magnitude near the device. The relative orientation of the magnetic layers is reversible.

An example of a typical giant magnetoresistance device having a resistance value that can be selectively and reversibly varied between at least two stable resistance values or states is a multilayered structure as follows: 50 nm NiO/2.5 nm Co/1.9 nm Cu/4 nm Co/1.9 nm Cu/2.5 nm Co/50 nm NiO. This structure is termed a "symmetric spin valve" and is described by Egelhoff, et al, "Oxygen as a Surfactant in the Growth of Giant Magnetoresistance Spin Valves" J. Appl. Phys. 82, 6142 (1997), incorporated herein by reference. This example is not intended to limit the scope of the invention.

In the simplest embodiment of the present invention, shown schematically in FIG. 6c, a negative differential resistance device is coupled with a magnetic device having two stable resistance values determined by parallel or antiparallel alignment of the magnetic layers. (What is meant by "stable" resistance state or value is that no external magnetic field or voltage is necessary to maintain a selected resistance state or value.) Two operating curves, corresponding to two distinct pairs of logic states or memory values, are thereby defined for the resulting circuit. The state of the circuit does not change when the power to the circuit is removed. Therefore, the circuit comprising the negative differential resistance device and the magnetic device is non-volatile. Since the resistance of the magnetic device is selectable and reversible, the circuit is fully reprogrammable.

If the magnetic device is operated in a continuous resistance mode (as in a GMR-based sensor or read head) rather than in a 2-stable state mode described above, the I-V characteristics and stable operating points of the negative differential resistance device may be continuously varied.

Figure 7A:
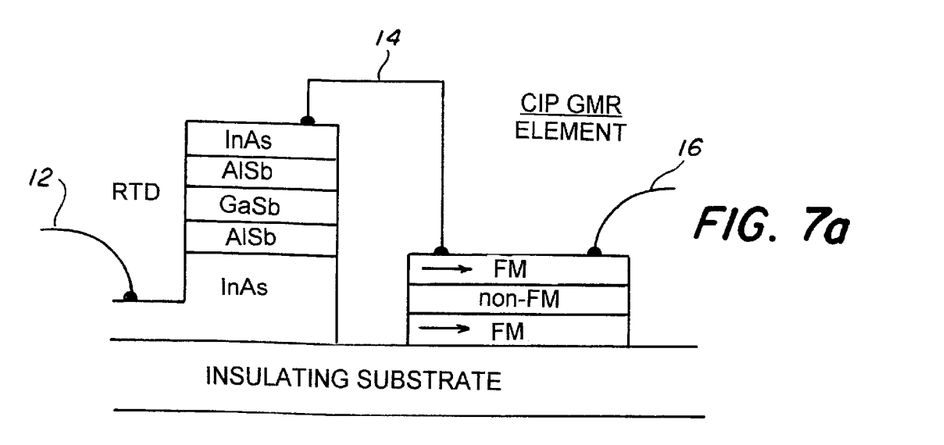
FIG. 7a is a cross-sectional representation of a resonant tunneling diode and current-in-plane (CIP) giant magnetoresistance device wherein the resonant tunneling diode and the giant magnetoresistance device are connected in a planar configuration.
Figure 7B:
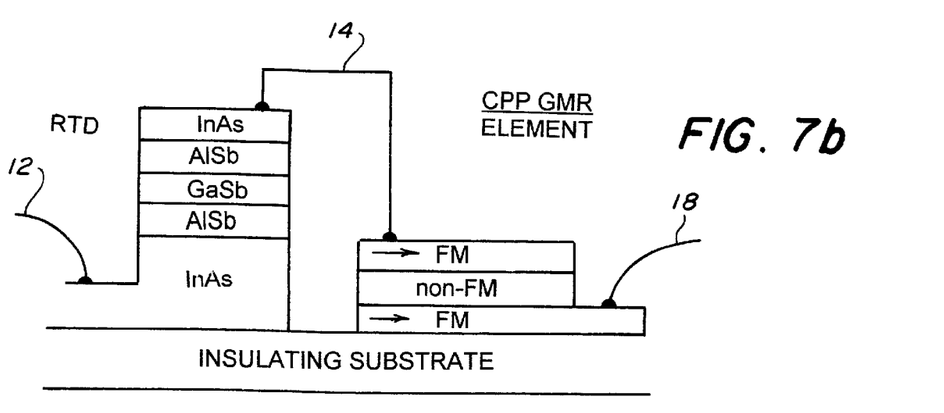
FIG. 7b is a cross-sectional representation of a resonant tunneling diode and current-perpendicular-to-plane (CPP) giant magnetoresistance device wherein the resonant tunneling diode and the giant magnetoresistance device are connected in a planar configuration.

A negative differential resistance device/magnetic device circuit can be physically implemented in either a planar or vertical manner. As represented in cross-section in FIGS. 7a and 7b, the planar configuration comprises a negative differential resistance device, exemplified by a resonant tunneling diode (RTD), and a magnetic device, represented by a giant magnetoresistance (GMR) element (which can be either standard current-in-plane (CIP) giant magnetoresistance element or a current-perpendicular-to-plane (CPP) giant magnetoresistance element), each deposited on an insulating substrate and connected in series. In the examples of FIG. 7a and 7b, a resonant tunneling device comprises stacked layers of InAs, AlSb, GaSb, AlSb and InSb. The giant magnetoresistance element is exemplified by a stack of ferromagnetic material (FM), non-ferromagnetic material (non-FM) and ferromagnetic material (FM). The relative orientation of the magnetic moment of the layers of ferromagnetic material is altered or switched by a current write line (not shown). In FIG. 7a, electrical leads 12, 14 and 16 are connected to the device so that electrical current can pass through the stack of layers of the resonant tunneling device, between the resonant tunneling device and the giant magnetoresistance element and along the plane of a layer of the giant magnetoresistance element. In FIG. 7b, electrical leads 12, 14 and 18 are connected to the device so that electrical current can pass through the stack of layers of the resonant tunneling device, between the resonant tunneling device and the giant magnetoresistance element and through the stack of layers of the giant magnetoresistance element.

Figure 8:
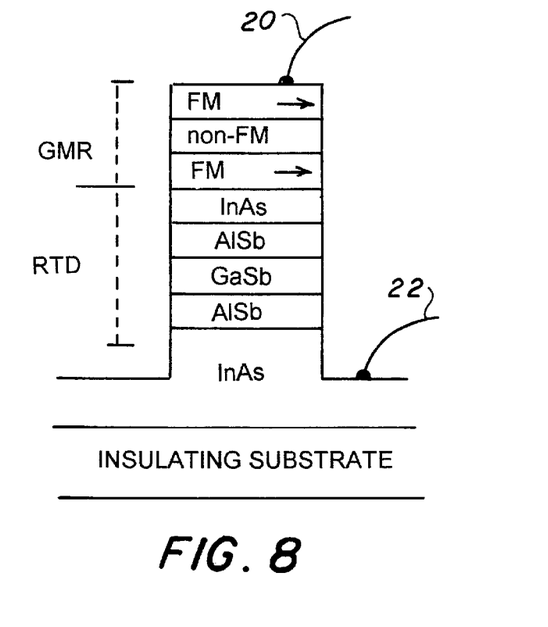
FIG. 8 is a cross-sectional representation of a resonant tunneling diode and a giant magnetoresistance device in a vertical configuration.

As shown schematically in FIG. 8, the vertical configuration is exemplified by a structure that includes a giant magnetoresistance (GMR) element having a layer of ferromagnetic material (FM), a layer of non-ferromagnetic material (non-FM) and a layer of ferromagnetic material (FM), all vertically integral to a resonant tunneling diode (RTD), which includes a layer of InAs, a layer of AlSb, a layer of GaSb, a layer of AlSb and a layer of InSb. The structure is on an insulating substrate. The relative orientation of the magnetic moment of the layers of ferromagnetic material is altered or switched by a current write line (not shown), Electrical leads 20 and 22 are positioned to direct electrical current through the entire stack. This configuration provides a highly compact geometry and is readily scalable to very small device sizes.

Programmable Non-Volatile Multiple-Value Logic

The above concepts can be extended directly to implement reprogrammable, non-volatile multiple-value logic using either series or parallel combinations of negative differential resistance devices and magnetic devices. For example, multiple magnetic devices can be combined in series with a negative differential resistance device to produce a circuit with multiple, reversibly selectable operating curves. Since each magnetic element has at least 2 stable values of resistance, adding N such elements in series with the negative differential resistance device provides at least $2^N$ discrete operating curves, or pairs of logic values or memory states.

Figure 5B:
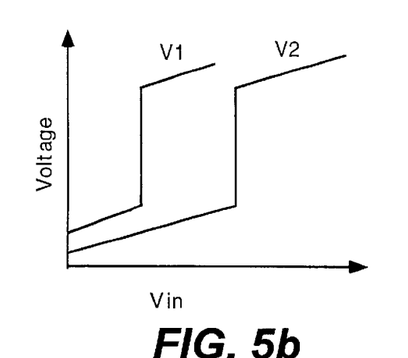

As another example, magnetic devices can be used in place of fixed load resistors in multiple-value logic cells to give these logic cells the properties of non-volatility and reprogrammability. Multiple-value logic (MVL) circuits currently described in the art contain parallel combinations of resonant tunneling diode subsystems, each subsystem comprising a resonant tunneling device in series with a fixed load resistor. (See L. J. Micheel and M. J. Paulus, "Differential Multiple-Valued Logic Using Resonant Tunneling Diodes", Proc. 20th Intl. Symp. Multiple-valued Logic, Charlotte, N.C., 1990, pp. 189–195, incorporated herein by reference and P. Mazumder, supra, page 678.) Such a circuit, depicted in FIG. 5a, uses resonant tunneling diodes, RTD1 and RTD2, of different diameters (peak currents), so that the smaller diameter resonant tunneling device switches first. For a given fixed value of the input resistance Rin, the output voltages are shown in FIG. 5b.

Figure 5C:
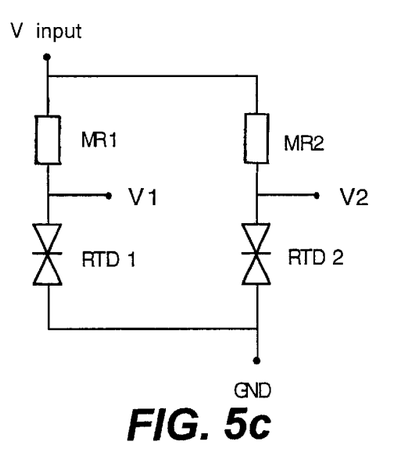
FIG. 5c is a circuit diagram of a multiple logic circuit of the present invention, the multiple value logic circuit being made up of two subsystems in parallel, each subsystem being made up of a resonant tunneling diode and a magnetic resistance device.
Figure 5D:
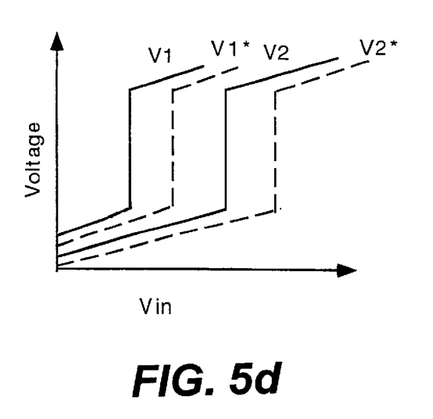
FIG. 5d is a graph showing the current-voltage characteristics of each subsystem of the circuit of FIG. 5c.

Because the load resistor of the typical multiple-value logic circuit has a fixed resistance, the logic cell is not programmable. That is, the operating characteristics of the logic cell cannot be altered once the device is constructed. In the present invention, by providing magnetic devices having reversibly variable resistance in place of the fixed load resistors, a logic cell can be created in which the operating voltages can be reprogrammed in a non-volatile manner. This embodiment of the present invention is depicted in FIG. 5c, wherein RTD1 and RTD2 represent negative differential resistance devices (exemplified herein as resonant tunneling diodes) having different diameters, and MR1 and MR2 represent magnetic devices having reversibly variable resistance. For different values of the variable resistance, the output voltages are shown in 5d. As shown in FIG. 5d, the output of the multiple value logic gate of a logic cell having two negative differential resistance devices can be reversibly programmed to include any two of the four curves shown in FIG. 5d.

Non-Volatile MOBILE Circuit

One form of logic cell based on resonant tunneling diodes utilizes two resonant tunneling diodes of different diameters connected in series, with a field effect transistor (FET) connected in parallel with the smaller area resonant tunneling diode. This circuit, which is an example of a logic structure referred to as a monostable-bistable transition logic element (MOBILE), is shown in FIG. 4 and described, in K. J. Chen, T. Akeyoshi and K. Maezawa "Monostable-Bistable Transition Logic Elements (MOBILEs) Based on Monolithic Integration of Resonant Tunneling Diodes and FETs", Jpn. J. Appl. Phys. 34, Pt. 1, No. 2B, 1199 (1995) and K. Arai et al., "Static Frequency Divider Featuring Reduced Circuit Complexity by Utilizing Resonant Tunneling Diodes in Combination with HEMT's" IEEE Electron Device Lett. 18, 544 (1997), incorporated herein by reference. In this circuit, the size of the resonant tunneling diode determines the current at which it switches, with the smaller resonant tunneling diode switching at lower currents. With the field effect transistor "OFF" (non-conducting), the lower (smaller) resonant tunneling diode determines the switching current and voltage of the cell, while the larger resonant tunneling diode is effectively a resistor since it does not reach peak current. The response of the logic cell is changed by turning the field effect transistor "ON" (conducting), providing a current shunt around the smaller resonant tunneling diode, preventing it from reaching its peak current and switching. Now the upper (larger) resonant tunneling diode is able to reach its peak current and switch, and thus controls the output of the cell. This cell logic is volatile, however, since the field effect transistor is a volatile device that requires power to retain its state, and reverts to its "normally off" state upon loss of power.

Figure 9:
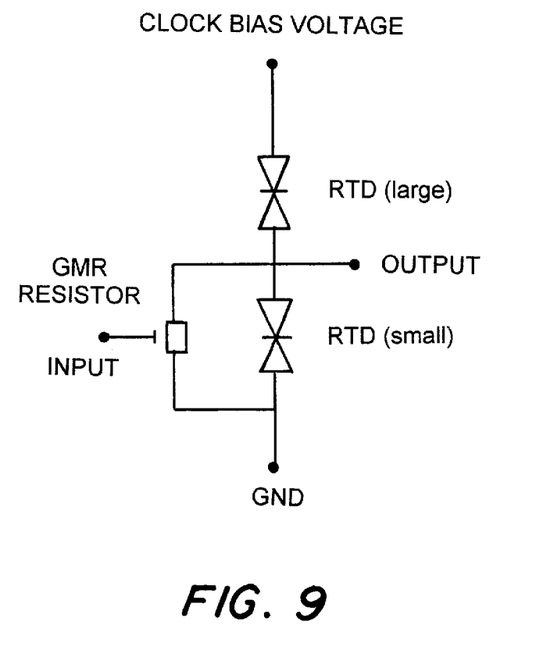
FIG. 9 is a circuit diagram of a monostable-bistable transition logic element (MOBILE) of the present invention, incorporating a magnetic resistance device.

FIG. 9 is a circuit diagram of a non-volatile MOBILE circuit according to the present invention. In this logic circuit, a magnetic device having reversibly variable resistance is used as a shunt in place of the field effect transistor of FIG. 4. The MOBILE circuit according to the present invention thus includes a first negative differential resistance (NDR) device (exemplified as a resonant tunneling device, RTD (large)) having a relatively high switching current, a second NDR device (exemplified as a resonant tunneling device, RTD (small)) having a relatively low switching current and a magnetic device (exemplified as a giant magnetoresistance device, GMR Resistor) having a resistance that can be selectively and reversibly varied between two stable states of relatively high resistance and relatively low resistance, respectively. The first NDR device and the second NDR device are connected in series, and the magnetic device and the second NDR device are connected in parallel. This logic cell has the same cell functionality and component count as the FET-based logic cell described above and shown in FIG. 4, with the added advantage that the operation of the magnetic device-based cell is non-volatile. In its high resistance state, the magnetic device element is "OFF" and more current flows through the lower negative differential resistance device, which is then able to reach its switching current and then controls the logic state of the cell. When the magnetic device element is switched into its low resistance state (turned "ON"), it shunts current from the lower negative differential resistance device, so that the upper (larger) negative differential resistance device can now reach its switching current, and thus controls the output of the cell. The "ON" or "OFF" state of the magnetic device is retained when the power to the device is turned off. Thus, the magnetic device element provides the significant advantage of true non-volatile function and operation to the MOBILE cell. The resistance of the magnetic device element is selected by an applied magnetic field, for example, from the fringe field due to a pulsed current in a nearby conducting wire. A MOBILE cell may also be constructed with more than one magnetic device connected in parallel so that changing the resistance of any one of the magnetic devices changes the output of the cell.

Field Programmable Gate Arrays

The ability to program the operating characteristics of individual circuits containing negative differential resistance devices and magnetic devices as described above provides an entirely new approach to the design and implementation of programmable logic devices and field programmable gate arrays (FPGAs), which are revolutionizing some forms of computation and digital logic. A field programmable gate array is an integrated circuit logic device that comprises a matrix of interconnected logic cells that can be reversibly configured or programmed to perform a variety of specific computing tasks. Field programmable arrays are described, for example, in the following patents and publications incorporated herein by reference: U.S. Pat. No. RE 34,363 to Freeman, U.S. Pat. No. 5,469,003 to Kean; U.S. Pat. No. 5,847,577 to Trimberger; Hauck, S. "The Roles of FPGAs in Reprogrammable Systems" Proc. IEEE 86, (1998) pp 615–638; Fawcett, B. K., "Taking Advantage of Reconfigurable Logic" Proceedings of the $7^{th}$ Annual IEEE International, ASIC Conference and Exhibit, 1994, pp 227–230; Rajsuman, R., "Design of Reprogrammable FPLA", Electronic Letters. May. 25, 1989, Vol. 25, No. 11, pp 715–716; and Fawcett, B. K. and Watson, J. "Reconfigurable Processing with Field Programmable Gate Arrays", Proceedings of International Conference on Application Specific Systems, Architectures and Processors, 1996. ASAP 96 pp 293–302.

A disadvantage of typical field programmable gate arrays as they are currently known in the art is that are composed of volatile memory units such as SRAMs. A configuration program must be reloaded into the field programmable gate array each time that the system is powered up.

According to the present invention, a field programmable gate array is made up of interconnected logic cells, wherein each logic cell is a circuit that incorporates negative differential resistance devices and magnetic devices each having a resistance that can be selectively and reversibly varied between at least two stable states. The logic cells may be any of the embodiments of the invention described above, including MOBILE circuits and multiple value logic circuits. For altering the stable states of each of the magnetic devices, the field programmable gate array includes a set of current-carrying input lines or wires, each line being capable of applying a magnetic pulse to a magnetic device. As with field programmable gate arrays currently known in the art, the field programmable gate array of the present invention can be configured or programmed to perform specific computing tasks, but with the advantage that, because of the reversibility and non-volatility of the magnetic devices used in the present invention, any particular configuration is retained, even when power to the array is removed, until the array is reprogrammed.

Obviously, many modifications and variations of the present invention are possible in light of the above teachings. It is therefore to be understood that, within the scope of the appended claims, the invention may be practiced otherwise than as specifically described.

What is claimed is:

1. A circuit comprising at least one negative differential resistance (NDR) device and at least one magnetic device having reversibly variable resistance, wherein the NDR device and the magnetic device are operatively connected so that changing the resistance of the at least one magnetic device changes the NDR current-voltage characteristics of the circuit.

2. The circuit of claim 1 wherein the at least one negative differential resistance device is a resonant tunneling diode.

3. The circuit of claim 1 wherein the at least one negative differential resistance device is a resonant interband tunneling diode.

4. The circuit of claim 1 wherein the at least one magnetic device is a giant magnetoresistive device.

5. The circuit of claim 1 wherein the at least one magnetic device is a spin-dependent tunnel junction device.

6. The circuit of claim 1 wherein the at least one negative differential resistance device and the at least one magnetic device are connected in series.

7. The circuit of claim 1 wherein the at least one negative differential resistance device and the at least one magnetic device are connected in parallel.

8. The circuit of claim 1 wherein the circuit is a component of a field programmable gate array.

9. The circuit of claim 1 wherein the circuit is a component of a multiple value logic circuit.

10. A circuit comprising at least one negative differential resistance (NDR) device and at least one magnetic device having a resistance that can be selectively and reversibly varied between at least two stable resistance values or states, wherein the NDR device and the magnetic device are operatively connected to so that changing the resistance of the magnetic device changes the NDR current-voltage response characteristics of the circuit.

11. The circuit of claim 10 wherein the negative differential resistance device is a resonant tunneling diode.

12. The circuit of claim 10 wherein the negative differential resistance device is a resonant interband tunneling diode.

13. The circuit of claim 10 wherein the magnetic device is a giant magnetoresistive device or a spin-dependent tunnel junction device.

14. The circuit of claim 10 wherein the negative differential resistance device and the magnetic device are connected in series.

15. The circuit of claim 10 wherein the negative differential resistance device and the magnetic device are connected in parallel.

16. The circuit of claim 10 wherein the circuit is a component of a field programmable gate array.

17. The circuit of claim 10 wherein the circuit is a component of multiple value logic circuit.

18. A circuit comprising a negative differential resistance (NDR) device and a plurality of magnetic devices, each magnetic device having a resistance that can be selectively and reversibly varied between at least two stable states, wherein the negative differential resistance device and the magnetic devices are operatively connected in series so that changing the resistance of any of the magnetic devices from one stable state to another changes the NDR current-voltage response characteristics of the circuit.

19. The circuit of claim 18 wherein the circuit is a component of a field programmable array or a multiple value logic circuit.

20. A circuit comprising a negative differential resistance (NDR) device and a plurality of magnetic devices, each magnetic device having a resistance that can be selectively and reversibly varied between at least two stable states, wherein the negative differential resistance device and the magnetic devices are operatively connected in parallel so that changing the resistance of any of the magnetic devices from one stable state to another changes the NDR current-voltage response characteristics of the circuit.

21. The circuit of claim 20 wherein the circuit is a component of a field programmable gate array or a multiple value logic circuit.

22. An apparatus comprising
a negative differential resistance (NDR) device,
a magnetic device having a resistance that can be selectively and reversibly varied between at least two stable states, wherein the magnetic device is a giant magnetoresistive device or a spin-dependent tunnel junction device, and
means for selectively and reversibly varying the resistance of the magnetic device between the at least two stable states, wherein the means for selectively and reversibly varying the resistance of the magnetic device element comprises a current-carrying wire for applying a magnetic field pulse to the magnetic device and wherein the negative differential resistance device and the magnetic device are operatively connected to form a circuit so that changing the resistance of the magnetic device from one stable state to another changes the NDR current-voltage response characteristics of the circuit.

23. A circuit comprising a plurality of circuit subunits, each circuit subunit comprising a negative differential resistance device (NDR) and at least one magnetic device having a resistance that can be selectively and reversibly varied between at least two stable states, wherein the negative differential resistance device and the at least one magnetic device are operatively connected in series so that changing the resistance of the at least one magnetic device element from one stable state to another changes the NDR current-voltage response characteristics of the circuit subunit and wherein the circuit subunits are operatively connected in parallel so that changing the resistance of any magnetic device from one stable state to another changes the output current-voltage response of the circuit to an input current or voltage.

24. The circuit of claim 23 wherein the circuit is a component of a field programmable gate array.

25. The circuit of claim 23 wherein the circuit is a component of a multiple value logic circuit.

26. A non-volatile monostable-bistable transition logic cell comprising a first negative differential resistance (NDR) device, a second NDR device and a magnetic device having a resistance that can be selectively and reversibly varied between two stable states of relatively high resistance and relatively low resistance, respectively,
wherein the first NDR device has a relatively high switching current and the second NDR device has a relatively low switching current,
wherein the first NDR device and the second NDR device are connected in series, and wherein the magnetic device and the second NDR device are connected in parallel so that when the magnetic device is in the high resistance state, more current is directed through the second NDR device so that it is able to reach its switching current and thereby controls the output of the cell, and when the magnetic device is in the low resistance state, less current is directed through the second NDR device, so that it is not able to reach its switching current, and the first NDR device is able to reach its switching current and thereby controls the output of the cell.

27. The non-volatile monostable-bistable transition logic cell of claim 26 wherein the non-volatile monostable-bistable transition logic cell is an element of a field programmable gate array.

28. The non-volatile monostable-bistable transition logic cell of claim 26 wherein the non-volatile monostable-bistable transition logic cell is an element of a multivalue logic circuit.

29. The non-volatile monostable-bistable transition logic cell of claim 26 wherein the first NDR device and the second NDR device are resonant tunneling diodes.

30. The non-volatile monostable-bistable transition logic cell of claim 26 wherein the first NDR device and the second NDR device are resonant interband tunneling diodes.

31. The non-volatile monostable-bistable transition logic cell of claim 26 wherein the magnetic device is a giant magnetoresistive device.

32. The non-volatile monostable-bistable transition logic cell of claim 26 wherein the magnetic device is a spin-dependent tunnel junction device.

33. A non-volatile monostable-bistable transition logic cell comprising a first resonant tunneling diode (RTD), a second RTD and a magnetic device having a resistance that can be selectively and reversibly varied between two stable states of relatively high resistance and relatively low resistance, respectively, wherein the magnetic device is a giant magnetoresistive device or a spin-dependent tunnel junction device, wherein the first RTD has a relatively high switching current and the second RTD has a relatively low switching current, wherein the first RTD and the second RTD are connected in series, and wherein the magnetic device and the second RTD are connected in parallel so that when the magnetic device is in the high resistance state, more current is directed through the second RTD so that it is able to reach its switching current and thereby controls the output of the cell, and when the magnetic device is in the low resistance state, less current is directed through the second RTD so that it is not able to reach its switching current and the first RTD is able to reach its switching current and thereby controls the output of the cell.

34. A non-volatile monostable-bistable transition logic cell comprising a first negative differential resistance (NDR) device, a second NDR device and a plurality of magnetic devices, each magnetic device providing a separate logic input and having a resistance that can be selectively and reversibly varied between two stable states of relatively high resistance and relatively low resistance, respectively, wherein the first NDR device has a relatively high switching current and the second NDR device has a relatively low switching current, wherein the first NDR device and the second NDR device are connected in series, and wherein the magnetic devices and the second NDR device are connected in parallel so that when all the magnetic devices are in the high resistance state, more current is directed through the second NDR device so that it is able to reach its switching current and thereby controls the output of the cell, and when any one of the magnetic device is in the low resistance state, less current is directed through the second NDR device, so that it is not able to reach its switching current, and the first NDR device is able to reach its switching current and thereby controls the output of the cell.

35. The non-volatile monostable-bistable transition logic cell of claim 34 wherein the non-volatile monostable-bistable transition logic cell is a component of a field programmable gate array.

36. The non-volatile monostable-bistable transition logic cell of claim 34 wherein the non-volatile monostable-bistable transition logic cell is a component of a multivalue logic circuit.

37. The non-volatile monostable-bistable transition logic cell of claim 34 wherein the first NDR device and the second NDR device are resonant tunneling diodes.

38. The non-volatile monostable-bistable transition logic cell of claim 34 wherein the first NDR device and the second NDR device are resonant interband tunneling diodes.

39. The non-volatile monostable-bistable transition logic cell of claim 34 wherein the magnetic devices are giant magnetoresistive devices or spin-dependent tunnel junction devices.

40. The non-volatile monostable-bistable transition logic cell of claim 34 wherein the first NDR device and the second NDR device are resonant tunneling diodes and the magnetic devices are giant magnetoresistive devices or spin-dependent tunnel junction devices.

41. A circuit comprising a negative differential resistance (NDR) device and a plurality of magnetic devices, each magnetic device having a resistance that can be selectively and reversibly varied between at least two stable states, wherein the magnetic devices are operatively connected in parallel to form a subcircuit, and said subcircuit and the NDR device are operatively connected in series, so that changing the resistance of at least one of the magnetic devices from one stable state to another changes the NDR current-voltage response characteristics of the circuit.

42. The circuit of claim 41 wherein the NDR devices are resonant tunneling diodes or resonant interband tunneling diodes.

43. The circuit of claim 41 wherein the magnetic devices are giant magnetoresistive devices or spin-dependent tunnel junction devices.

44. The circuit of claim 41 wherein the circuit is an element of a field programmable gate array or multivalue logic circuit.

45. A field programmable gate array comprising a matrix of interconnected logic cells, wherein each logic cell is a circuit that comprises at least one negative differential resistance (NDR) device and at least one magnetic device having a resistance that can be selectively and reversibly varied between at least two stable states, wherein the at least one NDR device and the at least one magnetic device are operatively connected so that changing the resistance of the at least one magnetic device changes the NDR current-voltage characteristics of the circuit, and a set of current-carrying lines, each line being located proximate to one of the magnetic devices so that the line is capable of applying a magnetic pulse to the magnetic device to alter the stable state and change the resistance of the magnetic device, and wherein the matrix can be reversibly configured to perform specific computing tasks by selecting the resistance of each of the magnetic devices.

46. The field programmable gate array of claim 45 wherein the NDR devices are resonant tunneling diodes or resonant interband tunneling diodes.

47. The field programmable gate array of claim 45 wherein the magnetic devices are giant magnetoresistive devices or spin-dependent tunnel junction devices.

48. The field programmable gate array of claim 45 wherein each circuit comprises a negative differential resistance device and a plurality of magnetic devices, all connected in series.

49. The field programmable gate array of claim 45 wherein each circuit comprises a negative differential resistance device and a plurality of magnetic devices, all connected in parallel.

50. The field programmable gate array of claim 45 wherein each circuit comprises a plurality of circuit subunits, each circuit subunit comprising a negative differential resistance device (NDR) and at least one magnetic device having a resistance that can be selectively and reversibly varied between at least two stable states, wherein the negative differential resistance device and the at least one magnetic device are operatively connected in series so that changing the resistance of the at least one magnetic device element from one stable state to another changes the NDR current-voltage response characteristics of the circuit subunit and wherein the circuit subunits are operatively connected in parallel so that changing the resistance of any magnetic device from one stable state to another changes the output current-voltage response of the circuit to an input current or voltage.

51. The field programmable gate array of claim 45 wherein each circuit comprises a first negative differential resistance (NDR) device, a second NDR device and a magnetic device having a resistance that can be selectively and reversibly varied between two stable states of relatively high resistance and relatively low resistance, respectively, wherein the first NDR device has a relatively high switching current and the second NDR device has a relatively low switching current, wherein the first NDR device and the second NDR device are connected in series, and wherein the magnetic device and the second NDR device are connected in parallel so that when the magnetic device is in the high resistance state, more current is directed through the second NDR device so that it is able to reach its switching current and thereby controls the output of the cell, and when the magnetic device is in the low resistance state, less current is directed through the second NDR device, so that it is not able to reach its switching current, and the first NDR device is able to reach its switching current and thereby controls the output of the cell.

52. The field programmable gate array of claim 45 wherein each circuit comprises a first resonant tunneling diode (RTD), a second RTD and a magnetic device having a resistance that can be selectively and reversibly varied between two stable states of relatively high resistance and relatively low resistance, respectively, wherein the magnetic device is a giant magnetoresistive device or a spin-dependent tunnel junction device, wherein the first RTD has a relatively high switching current and the second RTD has a relatively low switching current, wherein the first RTD and the second RTD are connected in series, and wherein the magnetic device and the second RTD are connected in parallel so that when the magnetic device is in the high resistance state, more current is directed through the second RTD so that it is able to reach its switching current and thereby controls the output of the cell, and when the magnetic device is in the low resistance state, less current is directed through the second RTD so that it is not able to reach its switching current and the first RTD is able to reach its switching current and thereby controls the output of the cell.

53. The field programmable gate array of claim 45 wherein each circuit comprises a first negative differential resistance (NDR) device, a second NDR device and a plurality of magnetic devices, each magnetic device providing a separate logic input and having a resistance that can be selectively and reversibly varied between two stable states of relatively high resistance and relatively low resistance, respectively, wherein the first NDR device has a relatively high switching current and the second NDR device has a relatively low switching current, wherein the first NDR device and the second NDR device are connected in series, and wherein the magnetic devices and the second NDR device are connected in parallel so that when all the magnetic devices are in the high resistance state, more current is directed through the second NDR device so that it is able to reach its switching current and thereby controls the output of the cell, and when any one of the magnetic device is in the low resistance state, less current is directed through the second NDR device, so that it is not able to reach its switching current, and the first NDR device is able to reach its switching current and thereby controls the output of the cell.

* * * * *